(12) United States Patent
Klein et al.

(10) Patent No.: US 11,646,244 B2
(45) Date of Patent: May 9, 2023

(54) SOCKET LOADING MECHANISM FOR PASSIVE OR ACTIVE SOCKET AND PACKAGE COOLING

(71) Applicant: Intel Corporation, Santa Clara, CA (US)

(72) Inventors: Steven A. Klein, Chandler, AZ (US); Zhimin Wan, Chandler, AZ (US); Chia-Pin Chiu, Tempe, AZ (US); Shankar Devasenathipathy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 723 days.

(21) Appl. No.: 16/454,343

(22) Filed: Jun. 27, 2019

(65) Prior Publication Data

US 2020/0411410 A1 Dec. 31, 2020

(51) Int. Cl.
| | |
|---|---|
| *H01L 23/40* | (2006.01) |
| *H01R 12/71* | (2011.01) |
| *H01R 13/73* | (2006.01) |
| *H01L 23/427* | (2006.01) |

(52) U.S. Cl.
CPC ........ *H01L 23/4006* (2013.01); *H01L 23/427* (2013.01); *H01R 12/716* (2013.01); *H01R 13/73* (2013.01); *H01L 2023/4062* (2013.01); *H01L 2023/4087* (2013.01)

(58) Field of Classification Search
CPC .......... H01R 12/716–718; H01L 23/34–4735; H01L 21/4871–4882; H01L 2023/4062
See application file for complete search history.

(56) References Cited

U.S. PATENT DOCUMENTS

| | | | |
|---|---|---|---|
| 6,840,794 B2 | 1/2005 | Chiu | |
| 6,840,795 B1 | 1/2005 | Takeda et al. | |

*Primary Examiner* — Amar Movva
(74) *Attorney, Agent, or Firm* — Essential Patents Group, LLP.

(57) ABSTRACT

A microprocessor mounting apparatus comprising a microprocessor socket on a printed circuit board (PCB) and a bolster plate surrounding a perimeter of the microprocessor socket. The bolster plate has a first surface adjacent to the PCB, and a second surface opposite the first surface. A heat dissipation device is on the second surface of the bolster plate. The heat dissipation interface is thermally coupled to the microprocessor socket.

20 Claims, 18 Drawing Sheets

SOCKET LOADING MECHANISM FOR PASSIVE OR ACTIVE SOCKET AND PACKAGE COOLING

BACKGROUND

Thermal management is one of the principal issues for either single chip (e.g., integrated circuit) or multi-chip package as thermal design power (TDP) continues to increase. Currently, for server packages, most of the heat generated on the land side of the chip at the socket interface flows through the package to the heatsink overhead. This is due to the high thermal resistances of the package material of the chip, socket and printed circuit board on which the socket is mounted. As the TDP of IC packages increases to 1000 watts or more, very large current densities flow through socket pins into the IC package. Large amounts of heat generation at the level of the socket and printed circuit board occurs by power dissipation within the socket pins and contacts on the IC package. Higher TDP and therefore higher chip performance may be enabled if additional cooling solutions are present at the socket and board level.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
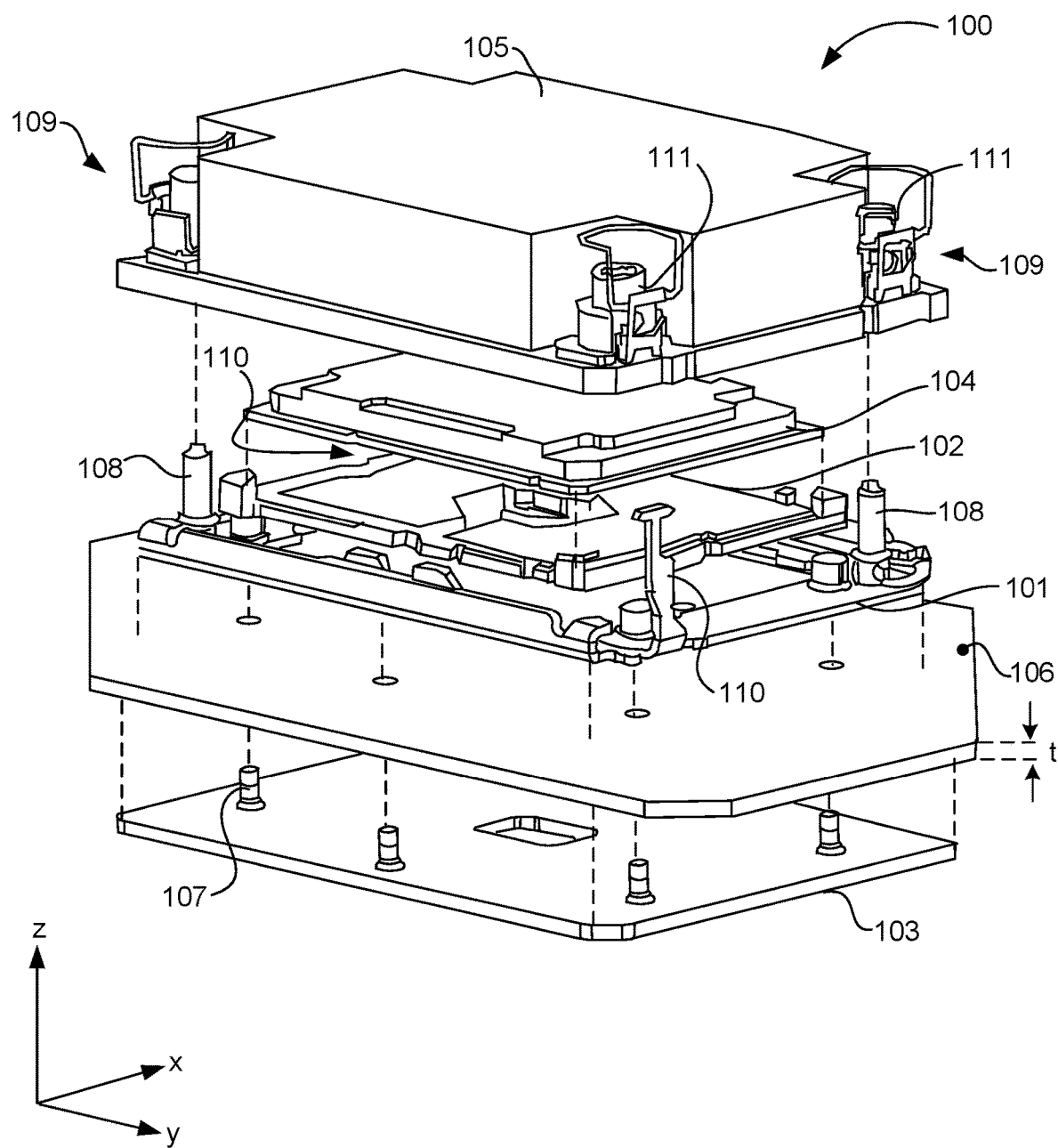
FIG. 1 illustrates an exploded oblique view of a loading mechanism, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

Here, the term "loading mechanism" generally refers to a mechanical structure to attach a CPU to a PCB or motherboard. The loading mechanism may include a heat sink and a means to bolt the heat sink over the CPU to the PCB or motherboard.

Here, the term "bolster plate" generally refers to a structure that is anchored to the PCB or motherboard. The bolster plate takes the mechanical load on the CPU imposed by fasteners securing the heat sink over the CPU, protecting the underlying PCB.

Here, the term "keep-away zone" generally refers to an area around a CPU for the purposes of thermal management of the CPU. A keep-away zone may be under the PCB or motherboard upon which the CPU is mounted.

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates an exploded oblique view of loading mechanism 100, according to some embodiments of the disclosure.

Loading mechanism 100 comprises bolster plate 101, socket 102 and back plate 103. IC device 104 is between socket 102 and heat sink 105. Socket 102 may be electrically coupled to trace routing (not shown) on printed circuit board (PCB) 106 by solder bonding. IC device 104 may be a microprocessor (CPU) or a graphical processing unit (GPU), or other IC computer chip (e.g., a field-programmable gate array (FPGA), serializer/deserializer (SerDes), memory, chipset, etc.). In some embodiments, socket 102 is omitted and IC device 104 is directly mounted on PCB 106 by solder reflow. PCB 106 may be a computer motherboard. Bolster plate 101 and back plate 103 are on opposing sides of PCB 106, and are bolted together through bolts 107. The assembly comprising bolster plate 101 and back plate 103 support high mechanical loads required to press heat sink 105 to IC device 104 for maximal heat transfer, and for compression seating IC device 104 in socket 102 for maximal electrical contact between the pin grid of socket 102 and the BGA or LGA of IC device 104.

Bolster plate 101 may absorb high loading forces (e.g., more than 100 lbs.) generated by attachment of heat sink 105 to PCB 106, mitigating mechanical stress on PCB 106. Heat sink 105 bolts onto bolster plate 101 through studs 108 inserting into fastener assemblies 109. Two or more leveling posts 110 (one of which is visible in foreground of the figure, the second is on a diagonal corner of bolster plate 101 and hidden) enable parallelism between heat sink 105 and IC device 104 as heat sink 105 is seated over IC device 104 and engages studs 108. Leveling posts 110 may maintain parallelism between heat sink 105 and IC device 104, and may substantially equalize forces on all points IC package and socket 102, as nuts 111 engage studs 108 and are tightened.

Socket 102 comprises a pin array (not shown) that interfaces with a corresponding ball grid array (BGA) or land grid array (LGA) of electrical contacts on the land side (e.g., bottom side of IC device 104, facing the motherboard or other PCB) of IC device 104 when seated in socket 102. The pin array may be anchored in a dielectric housing of socket 102, comprising materials having high thermal resistance. Socket 102 may be surface-mounted on PCB 106 by solder reflow joints (not shown). Socket 102 and PCB 106 may comprise dielectric materials having high thermal resistance. Large currents may pass through the socket pins and BGA during periods of high power consumption by IC device 104. Collectively, the interfacial area between the pin array of socket 102 and the BGA of IC device 104 is referred to as the interconnect plane (e.g., interconnect plane 220 in FIG. 2A). Periods of high power consumption may include burst periods or overclocking where IC device 104 may dissipate more than 300 watts, and in some instances, dissipate more than 1000 watts. During these periods, hundreds of amperes of current may flow through socket pins and BGA contacts, generating a large amount of heat within socket 102. In some implementations, loading mechanism 100 is part of a server computer having high CPU power demands.

Rejection of heat generated within socket 102 may occur conventionally by thermal conduction vertically (in the z-direction in the figure) through IC device 104 to heat sink 105. Other conventional heat flow paths include conductive heat transfer into surrounding PCB 106 from socket 102. Heat may flow both laterally along PCB 106 in all directions away from socket 102, and through the thickness t of PCB 106 to back plate 103.

Figure 2A:
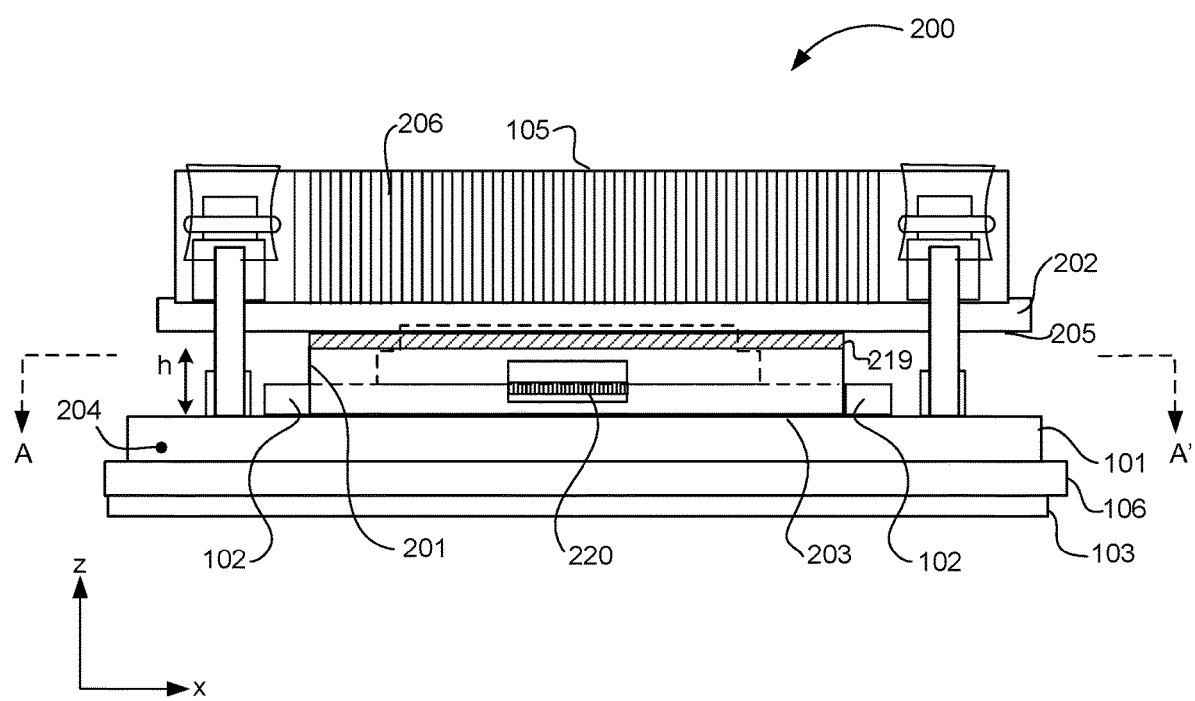
FIG. 2A illustrates a profile view in the x-z plane of a loading mechanism comprising thermal bridge mounted on a bolster plate, according to some embodiments of the disclosure.

FIG. 2A illustrates a profile view in the x-z plane of loading mechanism 200, according to some embodiments of the disclosure.

Loading mechanism 200 comprises bolster plate 101, socket 102, backing plate 103, and heat sink 105. Thermal bridge 201 extends vertically (in the z-direction of the figure) from bolster plate 101 to base plate 202 of heat sink 105. In some embodiments, thermal bridge 201 comprises metals such as, but not limited to, copper, brass, or steel. In some embodiments, thermal bridge 201 comprises a dielectric material exhibiting high thermal conductivity, such as, but not limited to, aluminum nitride. In some embodiments, thermal bridge 201 comprises a high thermal conductivity composite comprising graphite particles.

In some embodiments, thermal bridge 201 is attached to surface 203 of bolster plate 101. In some embodiments, thermal bridge 201 is near edge 204. Thermal bridge 201 has a z-height h that extends between upper surface 203 of bolster plate 101 and lower surface 205 of heat sink base plate 202. Z-height h may be less than the combined z-height of IC device 104 and socket 102 seated therein so as to enable full loading of IC device 104 by heat sink 105. Thermal bridge 201 interfaces with the two surfaces, and may thermally couple bolster plate 101 to base plate 202 of heat sink 105. Heat may be transferred passively through bolster plate 101 directly to heat sink 105 through thermal bridge 201. Heat sink 105 may dissipate heat by natural convection over fins 206 or by active mechanisms, such as forced convection (e.g., a blower) over fins 206. Alternate heat dissipation mechanisms may include employment of heat pipes (not shown) or a vapor chamber (not shown) interfacing with heat sink base plate 202. In implementations of loading mechanism 200, heat generated near the interconnect plane of an IC device (e.g., IC device 104 in FIG. 1, shown by hidden lines in FIG. 2A) may be conducted laterally to bolster plate 101 and vertically to heat sink 105 through thermal bridge 201.

In some embodiments, thermal interface material (TIM) layer 219 intervenes between thermal bridge 201 and heat sink base plate 202 to reduce resistance to heat transfer from thermal bridge 201 to heat sink base plate 202. A suitable thermal interface material may comprise a semi-liquid thermal grease, a thermal paste, a thermal gel, or a solid TIM pad. In some embodiments, thermal bridge 201 is bonded to bolster plate 101 by fasteners (not shown), such as machine screws or bolts. In some embodiments, thermal bridge 201 is diffusion-bonded to bolster plate surface 203. In some embodiments, thermal bridge 201 is joined to bolster plate 101 by brazing, where a thin layer of a third metal is between bolster plate surface 203 and thermal bridge 201.

Figure 2B:
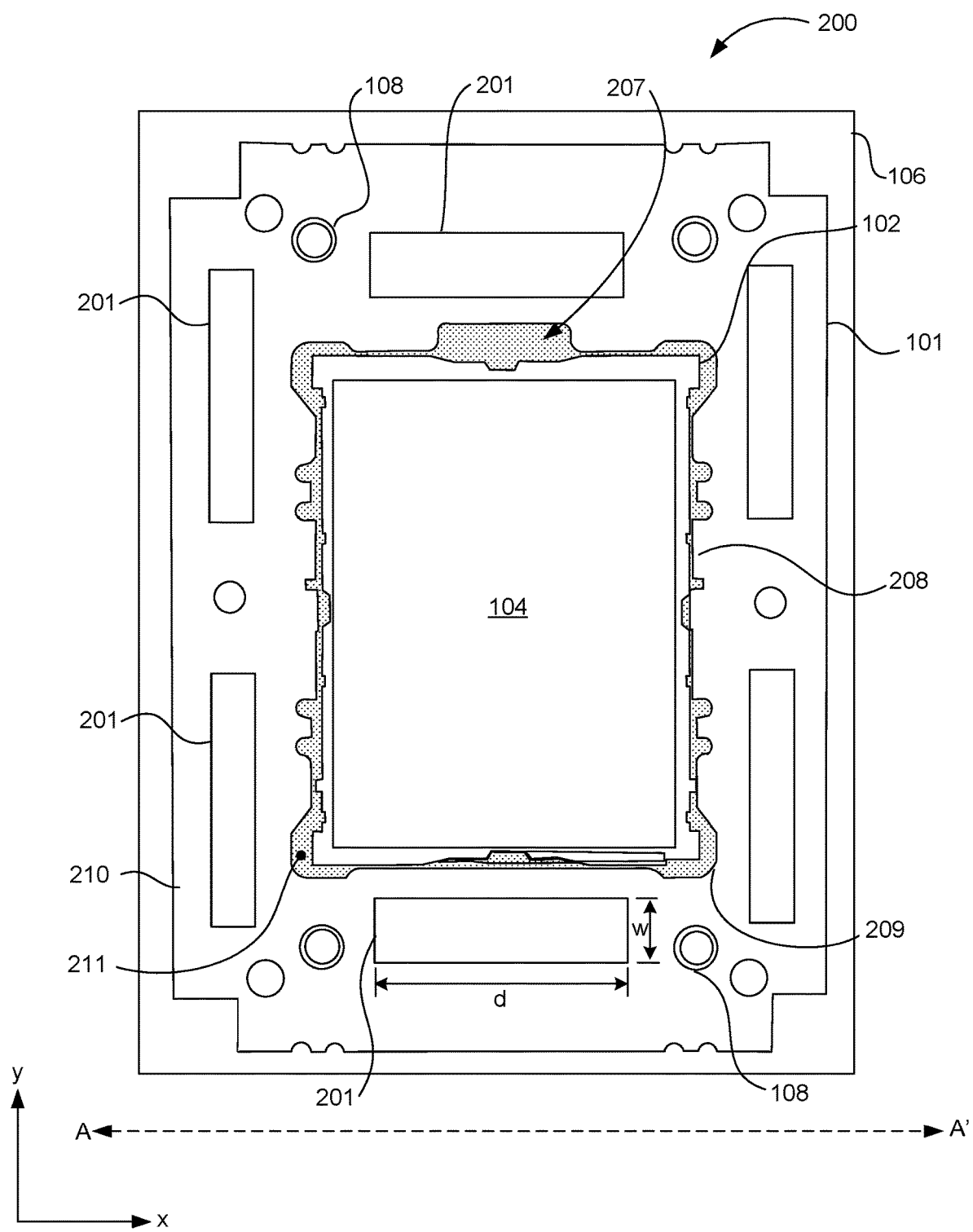
FIG. 2B illustrates a plan view in the x-y plane of the loading mechanism of FIG. 2A, according to some embodiments of the disclosure.

FIG. 2B illustrates a plan view in the x-y plane of loading mechanism 200, according to some embodiments of the disclosure.

Loading mechanism 200 is depicted in plan view in FIG. 2B below plane A-A' of FIG. 2A to show features that are under the heat sink component of loading mechanism 200 (e.g., heat sink 105 in FIG. 2A). Bolster plate 101 comprises aperture 207. Socket 102 is enclosed within aperture 207. Edge 208 of aperture 207 is shown to have multiple recesses 209 that may accommodate protruding structural features of socket 102, and may enable finger access to IC device 104. In the illustrated embodiment, multiple thermal bridges are deployed on bolster plate 101 near edges 210. It will be understood that any suitable number of thermal bridges 201 may be employed to attain a desired level of heat removal from the interconnect plane within socket 102.

Heat flowing laterally from socket 102 crosses aperture 207 to edge 208, where it is absorbed by bolster plate 101. In some embodiments, a thermal interface material (TIM) fill 211 fills the gap between socket 102 and edge 208. Lateral heat flow from socket 102 to bolster plate 101 may be enhanced by TIM fill 211 (stippled region within aperture 207), which comprises high thermal conductivity materials such as, but not limited to, a polymer matrix comprising a suitable polymer comprising silicones, urethanes, acrylates, and epoxies. The polymer matrix may comprise particles of carbon, copper, silver, aluminum oxide, boron nitride, zinc oxide, aluminum nitride, diamond or silicon carbide. In some embodiments, the polymer matrix is a viscous liquid grease, paste, gel. In some embodiments, the polymer matrix is a compliant solid pad.

TIM fill 211 may have a thermal conductivity that is significantly higher than PCB 106. As an example, TIM fill 211 may have a thermal conductivity of 3-10 W/mK, whereas PCB 106 comprising a F4 material may have an in-plane thermal conductivity of approximately 0.7 W/mK. For similar thickness, (e.g., PCB 106 may have a thickness of approximately 1.6 mm) TIM 211 may parallel flow path having a lower thermal resistance, and shunt PCB 106 for conductive heat flow between socket 102 and aperture edge 208. Thermal bridges 201 have lateral dimensions (e.g., width w and length d) that may be optimized for maximum vertical (in the z-direction) conductive heat transfer from bolster plate 101. As an example, length d width w may be optimized to maximize footprint overlap with bolster plate surface, with respect to positions of other structures on bolster plate such as studs 108. Optimization of number, locations and footprint dimensions of thermal bridges 201 may maximize the interception of heat flowing from aperture edge 208 into bolster plate 101.

Figure 3A:
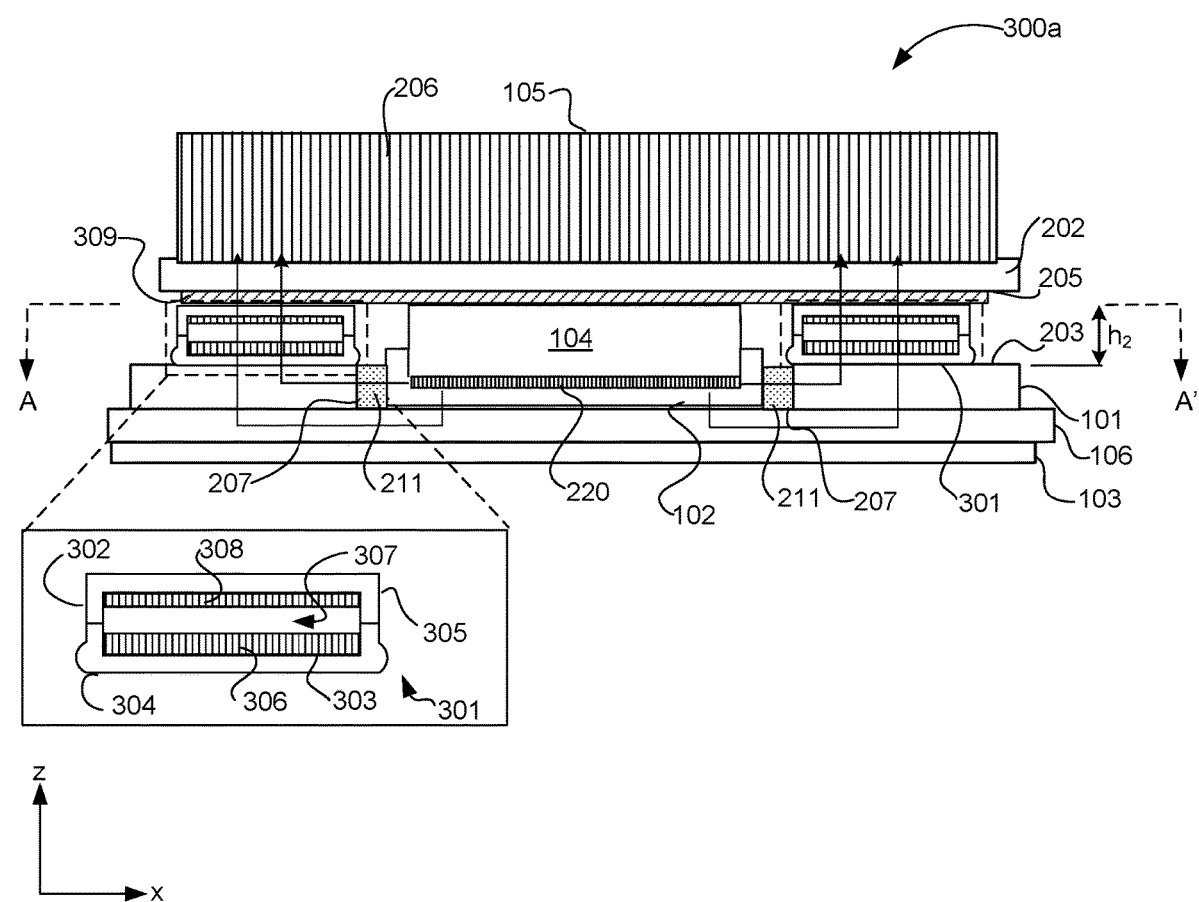
FIG. 3A illustrates a cross-sectional view in the x-z plane of a loading mechanism comprising a vapor chamber mounted on a bolster plate, according to some embodiments of the disclosure.

FIG. 3A illustrates a cross-sectional view in the x-z plane of loading mechanism 300a, according to some embodiments of the disclosure.

Loading mechanism 300a comprises vapor chamber 301 interfaced to bolster plate 101. Vapor chamber 301 comprises enclosure 302 around chamber 303. Further details of vapor chamber 301 is shown in the inset. In the illustrated embodiment, vapor chamber 301 is a ring-shaped structure (two segment cross-sections delineated by dashed enclosures) around aperture 207 containing TIM fill 211 (shown in plan view of FIG. 3C). Enclosure 302 comprises a metal such as, but not limited to, copper, steel, aluminum or nickel.

Referring to the inset in FIG. 3A, in some embodiments, enclosure 302 is a two-piece structure comprising two stamped plates, lower plate 304 and upper plate 305. Lower plate 304 and upper plate 305 may be diffusion bonded or welded together. Within chamber 303 is lower wicking structure 306. In some embodiments, lower wicking structure 306 comprises a sintered powder. The sintered powder may comprise materials such as, but not limited to, copper particles, boron nitride particles or aluminum nitride particles. In some embodiments, lower wicking structure 306 comprises a wire mesh support for sintered particles. Above lower wicking structure 306 is vapor space 307 that separates lower wicking structure 306 from upper wicking structure 308.

Wicking structures 306 and 308 are impregnated with a working fluid for high-efficiency heat transfer by evaporation and condensation. Generally, the working fluid may be in a liquid state at or below 20° C.-25° C. at atmospheric pressure, and vaporize at or below maximum operating temperatures for IC device 104. Suitable working fluids may include water or low molecular weight alcohols. Lower plate 304 is interfaced with bolster plate 101. Upper and lower wicking structures 306 and 308, respectively, may provide a large heat transfer surface area for vaporizing liquid working fluid residing within the interstices of the sintered material, or condensing vaporized working fluid within the interstices, transferring latent heat to the wicking structure.

During operation of IC device 104, lower plate 304 transfers heat from bolster plate 101, collected from socket 102 through TIM fill 211. Heat is transferred to the working fluid within lower wicking structure 306, vaporizing the working fluid into vapor space 307. Vapors may condense in upper wicking structure 308, transferring latent heat to upper plate 305. Upper plate 305 is interfaced to heat sink base plate 202, which carries the heat to fins 206. By natural or forced convection, fins 206 may dissipate the heat that originated in the interconnect plane to the surroundings. Vapor chamber 301 is an active heat transfer device, and may have a thermal conductivity between approximately 5000 and 100,000 W/mK. High thermal conductivity metals such as aluminum and copper have thermal conductivities of approximately 200 W/mK (aluminum) and approximately 400 W/mK (copper).

In some embodiments, one or more heat pipes may be substituted for vapor chamber 301. Heat pipes have similar thermal characteristics, and have a similar working principle. Vapor chambers are more compact and may be formed into wider structures than heat pipes to cover entire surfaces with a single device, thus being more cost efficient in some implementations than heat pipes. A heat pipe may extend from bolster plate 301 (311) to a remote heat sink or fan.

The heat flow path is indicated by the bent arrows in the figure, emanating from interconnect plane 220 between IC device 104 and socket 102. A secondary heat flow path may also be present, and is indicated by adjacent bent arrows having lighter lines and a smaller arrowhead to indicate less heat flow relative to the primary path indicated by the more robust arrows. Heat may travel from interconnect plane 220 through PCB 106. The vertical heat flow component may travel through bolster plate 101 to vapor chamber 301, to be dissipated to the surroundings by heat sink 105.

Vapor chamber 301 may have a z-height that is approximately equal to distance $h_2$ between bolster plate surface 203 and base plate surface 205. Upper plate 305 may be interfaced with heat sink base plate 202 through a thermal interface material TIM layer 309. As described above for thermal bridges 201 (FIG. 2A), TIM layer 309 may comprise a thermal grease or paste. Vapor chamber 301 may be securely retained on bolster plate 101 by heat sink base plate 202 when heat sink 105 is fastened to bolster plate 101 (see FIG. 1). In some embodiments, TIM layer 309 intervenes between vapor chamber top plate 305 and heat sink base plate 202. TIM layer 309 or a similar layer may also intervene between IC device 104 and heat sink base plate 202. In some embodiments, vapor chamber 301 is diffusion bonded to bolster plate 101. In some embodiments, vapor chamber 301 is fastened to bolster plate 101 by screws or bolts. In some embodiments, vapor chamber 301 is adhesion mounted to bolster plate 101 with a thermal adhesive. In some embodiments, vapor chamber 301 is tacked to bolster plate 101 by TIM layer 309.

Figure 3B:
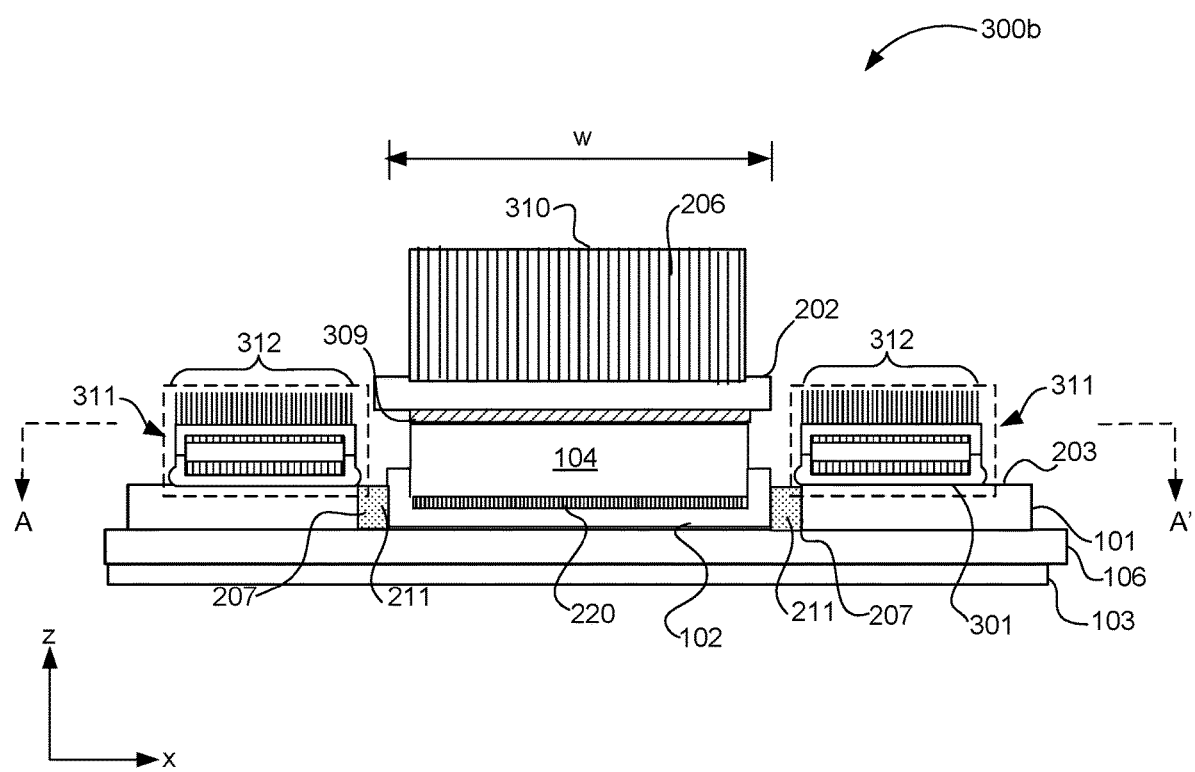
FIG. 3B illustrates a cross-sectional view in the x-z plane of a loading mechanism comprising a finned vapor chamber mounted on the bolster plate, according to some embodiments of the disclosure.

FIG. 3B illustrates a cross-sectional view in the x-z plane of loading mechanism 300b, according to some embodiments of the disclosure.

Loading mechanism 300b is depicted in plan view in FIG. 3B below plane A-A' of FIG. 3A to show features that are under the heat sink component of loading mechanism 300b (e.g., heat sink 105 in FIG. 3A). In FIG. 3B, heat sink 310 is a small heat sink relative to heat sink 105 in FIG. 3A, and may only have a width w in the x-dimension that is approximately the same as IC device 104. Upper plate 305 of vapor chamber 311 has an open interface with the atmosphere. Local heat dissipation fins 312 are bonded to upper plate 305 for convective heat dissipation from upper plate 305 of vapor chamber 311. In the illustrated embodiment, vapor chamber 311 is a ring-shaped structure (two segment cross-sections delineated by dashed enclosures) surrounding aperture 207. In some embodiments, vapor chamber 311 may comprise multiple separate segments. The description of structure and function of vapor chamber 301 may apply to vapor chamber 311.

Figure 3C:
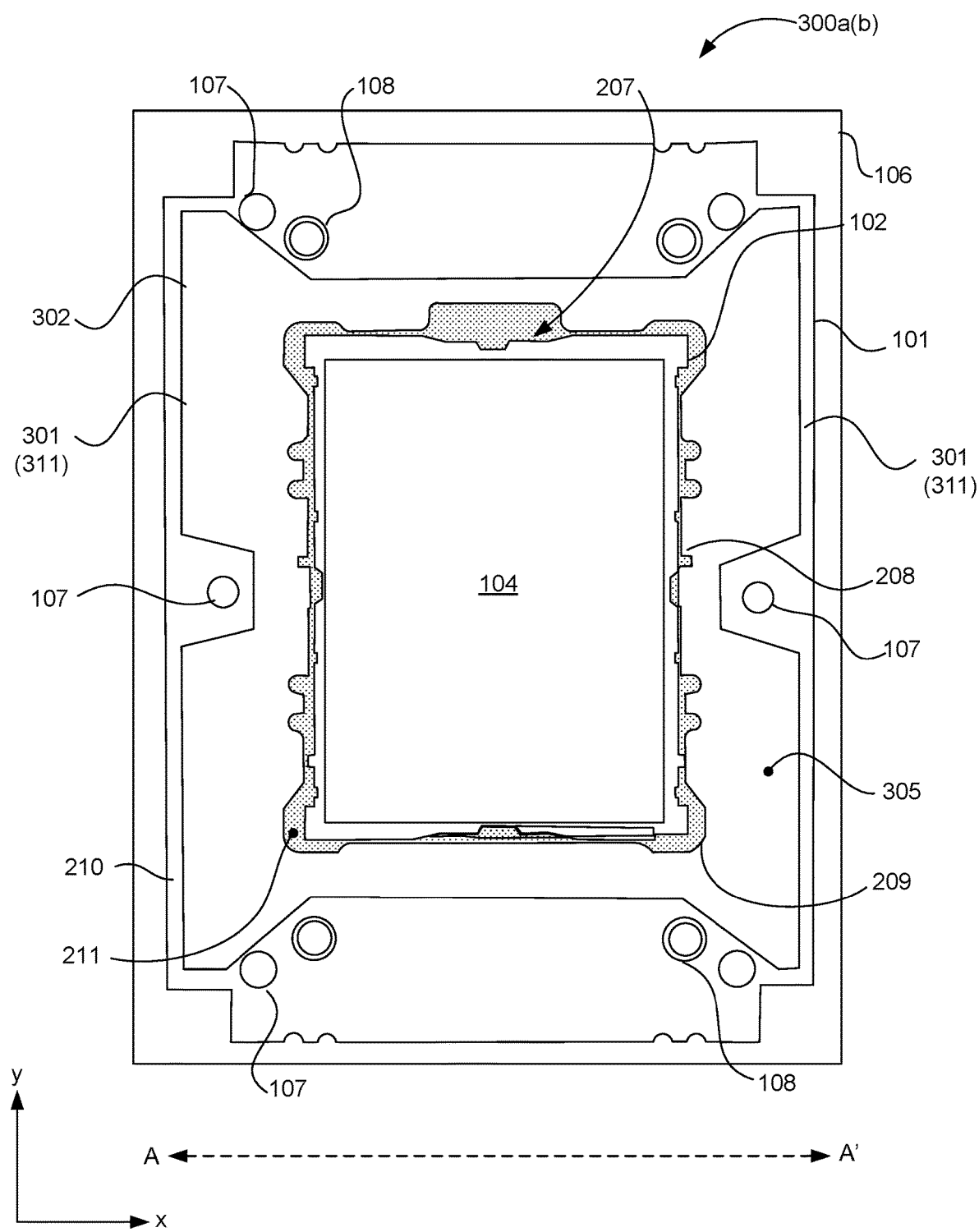
FIG. 3C illustrates a plan view in the x-y plane of the loading mechanism of FIGS. 3A and 3B, according to some embodiments of the disclosure.

FIG. 3C illustrate a plan view in the x-y plane of loading mechanism 300a or 300b, according to some embodiments of the disclosure.

Loading mechanism 300a(b) is depicted in the plan view in FIG. 3C below plane A-A' of FIG. 3A and FIG. 3B to show features that are under the heat sink component of loading mechanism 300a(b) (e.g., heat sink 105 in FIG. 3A). Bolster plate 101 is below (in the z-dimension) vapor chamber 301 or 311. The following description applied to both embodiments 301 (FIG. 3A) and 311 (FIG. 3B) of the vapor chamber are represented in FIG. 3C. In the illustrated embodiment, vapor chamber 301(311) is a rectangular ring-shaped structure comprising four contiguous straight segments that surround aperture 207 and TIM fill 211. In some embodiments, vapor chamber 301(311) comprises one or more disjointed units or segments between edges 208 of aperture 207 and edges 210 of bolster plate 101. TIM fill 211 may conduct heat that is generated by IC device 104 from socket 102 to bolster plate 101. As described above, vapor chamber 301(311) rapidly removes heat from bolster plate 101.

In the plan view, upper plate 305 of vapor chamber enclosure 302 is shown. In some embodiments, heat dissipation fins (e.g., fins 312, FIG. 3B) extend above upper plate 305 (e.g., vapor chamber 311, FIG. 3B). In some embodiments, a TIM (e.g., TIM 309) is a layer of TIM on upper plate 305 (e.g., vapor chamber 301, FIG. 3A).

Enclosure 302 of vapor chamber 301(311) may comprise upper plate 305 and lower plate 304 as a two-piece enclosure. Upper plate 305 and lower plate 304 may be bonded by diffusion bonding or by welding. The recessed perimeter of enclosure 302 may be formed by a stamping or machining process and contoured to fit the bolt (e.g., bolts 107) and stud (e.g., studs 108) pattern on bolster plate 101. Bolts 107 may extend through PCB 106 and bolster plate 101 from a back plate (e.g., back plate 103, not shown) below PCB 106. Studs 108 extend vertically (in the z-direction) from bolster plate 101 (see FIG. 1).

Figure 4A:
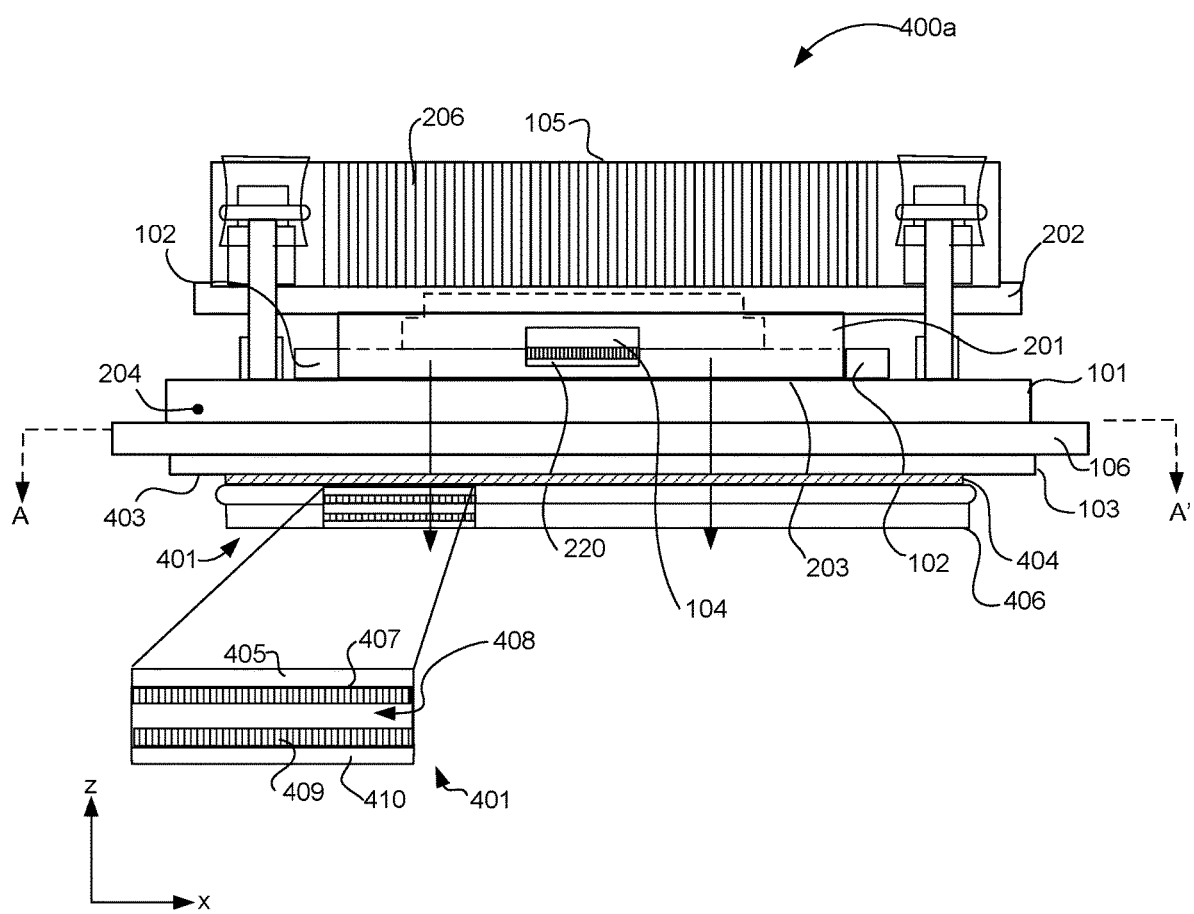
FIG. 4A illustrates a profile view in the x-z plane of a loading mechanism a vapor chamber mounted on a back plate, according to some embodiments of the disclosure.

FIG. 4A illustrates a profile view in the x-z plane of loading mechanism 400a, according to some embodiments of the disclosure.

Loading mechanism 400a comprises back plate 103 below PCB 106 and opposite bolster plate 101. In the illustrated embodiment, vapor chamber 401 is mounted on lower surface 403 of back plate 103. Vapor chamber 401 may be in close proximity to socket 102 as a consequence of the relatively small thickness (e.g., 1-2 mm) of back plate 103 and of PCB 106 (e.g., 1.6 mm), and provide a primary or secondary heat flow path from interconnect plane 220 (shown in the cutaway view behind thermal bridge 201) between IC device 104 (delineated by hidden lines) and pins of socket 102 (partially delineated by the hidden lines behind thermal bridge 201). A secondary heat flow path may be through IC device 104 to base plate 202 of heat sink 105. In the illustrated embodiment, thermal bridge 201 is between bolster plate 101 and heat sink 105, and may provide a primary heat flow path from interconnect plane 220, shown in the cut-away window through thermal bridge 201, in socket 102 to heat sink 105.

Vapor chamber 401 may have an internal construction similar to that of vapor chamber 301 (FIG. 3A). Vapor chamber 401 is mounted on back plate lower surface 403 by a high thermal-conductivity adhesive. In some embodiments, vapor chamber 401 is mounted on back plate lower surface 403 by a fastener such as, but not limited to, bolts or machine screws. In some embodiments, TIM 404 may intervene between back plate 103 and vapor chamber 401 for heat transfer enhancement. A heat flow path from interconnect plane 220 in socket 102 through vapor chamber 401 is indicated in the figure by the down-pointing arrows.

Referring to the inset showing a cut-away view of the interior of vapor chamber 401, heat arriving at the back plate lower surface 403 may flow into upper wall 405 of vapor chamber enclosure 406, and into wicking structure 407. In some embodiments, upper wall 405 corresponds to lower plate 304 of vapor chamber 301 in FIG. 3A. Working fluid (not shown) within interstices of wicking structure 407 may be vaporized heat transferred from the sintered particles of wicking structure 407. Working fluid vapor may enter vapor space 408 and interstices of wicking structure 409, where it may condense. Latent heat absorbed by wicking structure 408 may then flow to lower wall 410 of vapor chamber enclosure 406 where it may be dissipated to the surroundings by connective heat transfer.

Figure 4B:
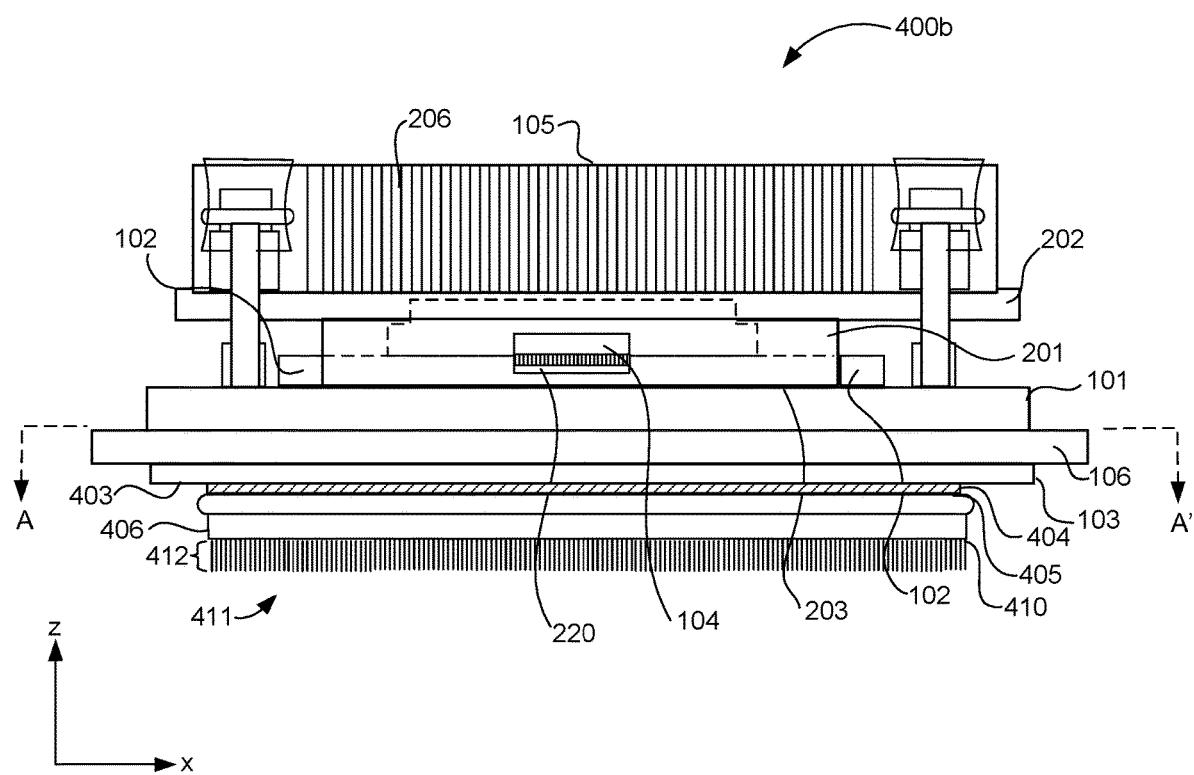
FIG. 4B illustrates a profile view in the x-z plane of a loading mechanism comprising a finned vapor chamber mounted on the back plate, according to some embodiments of the disclosure.

FIG. 4B illustrates a profile view in the x-z plane of loading mechanism 400b, according to some embodiments of the disclosure.

Loading mechanism 400b is depicted in plan view in FIG. 4B below plane A-A' of FIG. 4A to show features that are under the heat sink component of loading mechanism 400b (e.g., heat sink 105 in FIG. 4A). Loading mechanism 400b comprises vapor chamber 411 interfaced to lower surface 403 of back plate 103. In some embodiments, TIM layer 404 intervenes between upper wall 405 of vapor chamber 411 and back plate lower surface 403. In the illustrated embodiment, vapor chamber 411 comprises heat dissipation fins 412 extending below lower wall 410 of vapor chamber enclosure 406. The large effective thermal conductance of vapor chamber 411 may provide a primary heat flow path from interconnect plane 220. In some server implementations, the keep-out zone under PCB 106 below back plate 103 is large enough to accommodate both active and passive air flow ducting. Both forced and passive air flow over heat dissipation fins 412 may significantly increase convective heat transfer from vapor chamber 411.

Figure 4C:
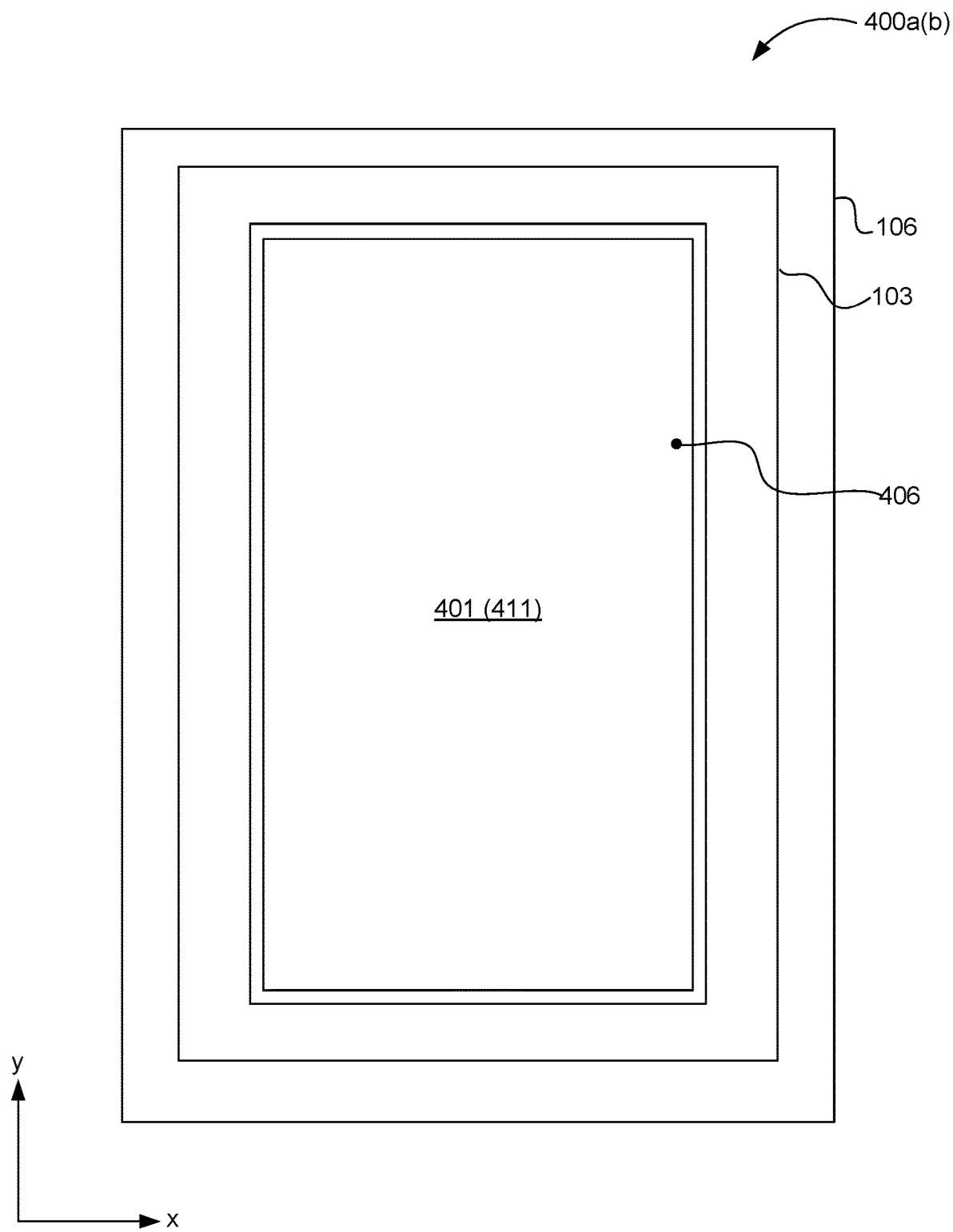
FIG. 4C illustrates a plan view in the x-y plane of the loading mechanism of FIGS. 4A and 4B, according to some embodiments of the disclosure.

FIG. 4C illustrates a plan view in the x-y plane of loading mechanism 400a or 400b below PCB 106, showing vapor chamber 401 or 411, according to some embodiments of the disclosure.

In FIG. 4C, the plan view of loading mechanism 400a or 400b is shown below the level of plane A-A' in FIGS. 4A and 4B. The plan view shows back plate 103 below PCB 106. In the illustrated embodiment, vapor chamber 401 (411) has a substantially rectangular geometry. Other suitable geometries are possible to conform to any arrangement of components on or below back plate 103. In some embodiments, enclosure 406 comprises a single piece of metal. As an example, enclosure 406 may be formed by flattening a cylindrical heat pipe. In some embodiments, enclosure 406 comprises two pieces of stamped or machined metal plate that are diffusion bonded together. Plates may be stamped to any suitable geometry.

Figure 5A:
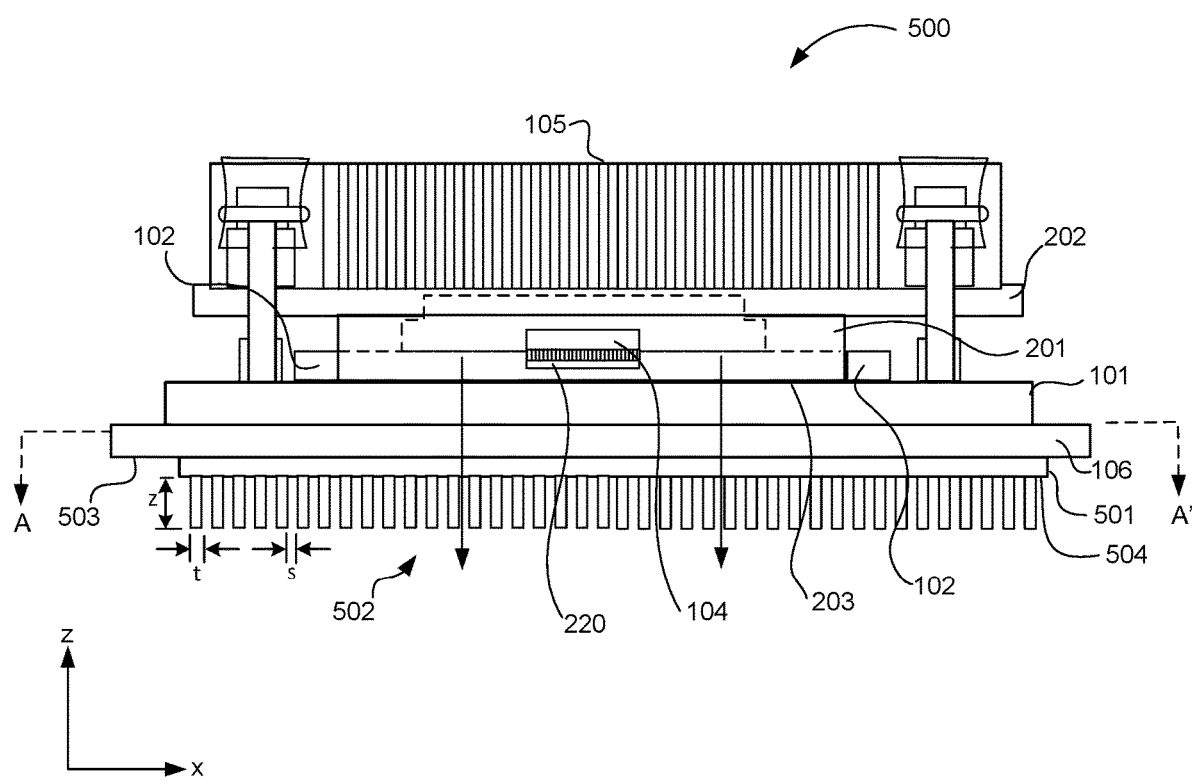
FIG. 5A illustrates a profile view in the x-z plane of a loading mechanism comprising a finned back plate, according to some embodiments of the disclosure.

FIG. 5A illustrates a profile view in the x-z plane of loading mechanism 500, according to some embodiments of the disclosure.

Loading mechanism 500 comprises finned back plate 501, comprising heat dissipation fins 502 extending from lower back plate surface 503 below PCB 106. In some embodiments, PCB 106 is a computer motherboard. Heat dissipation fins 502 extend a z-height z below (in the z-dimension) lower surface 504 of finned back plate 501 into the zone below PCB 106. Heat dissipation fins 502 may have a thickness t and a separation distance s. The extent of dimensions z, s and t may be optimized for maximum heat transfer from finned back plate 501.

Heat dissipation fins 502 may transfer heat passively to the surroundings by natural forced convection of air in the zone below PCB 106. As an example, fan ducting may be routed under the motherboard in a server station, providing forced air flow to heat dissipation fins 502. Finned back plate 501 may provide an additional heat rejection from interconnect plane 220. In the illustrated embodiment, heat emanating from interconnect plane 220 may flow through IC device 104 to heat sink 105 and through bolster plate 101 to thermal bridge 201, which thermally couples bolster plate 101 to heat sink 105. In addition to the heat flow paths leading to heat sink 105, heat emanating from interconnect plane 220 between IC device 104 and socket 102 may follow the heat flow path, indicated by the downward pointing arrows, through PCB 106 to finned back plate 501.

In some embodiments, thermal bridge 201 is not employed, and heat flow may follow vertical paths to finned back plate 501 and heat sink 105. Finned back plate 501 may be engineered (optimization of fin dimensions z, t and s in relation to air convection parameters) to provide maximal heat rejection in tandem with heat sink 105 in lieu of thermal bridge 201. As an example, a cooling fan may be sized to provide sufficient forced air flow to finned back plate 501 and heat sink 105 for a desired rate of heat rejection.

Figure 5B:
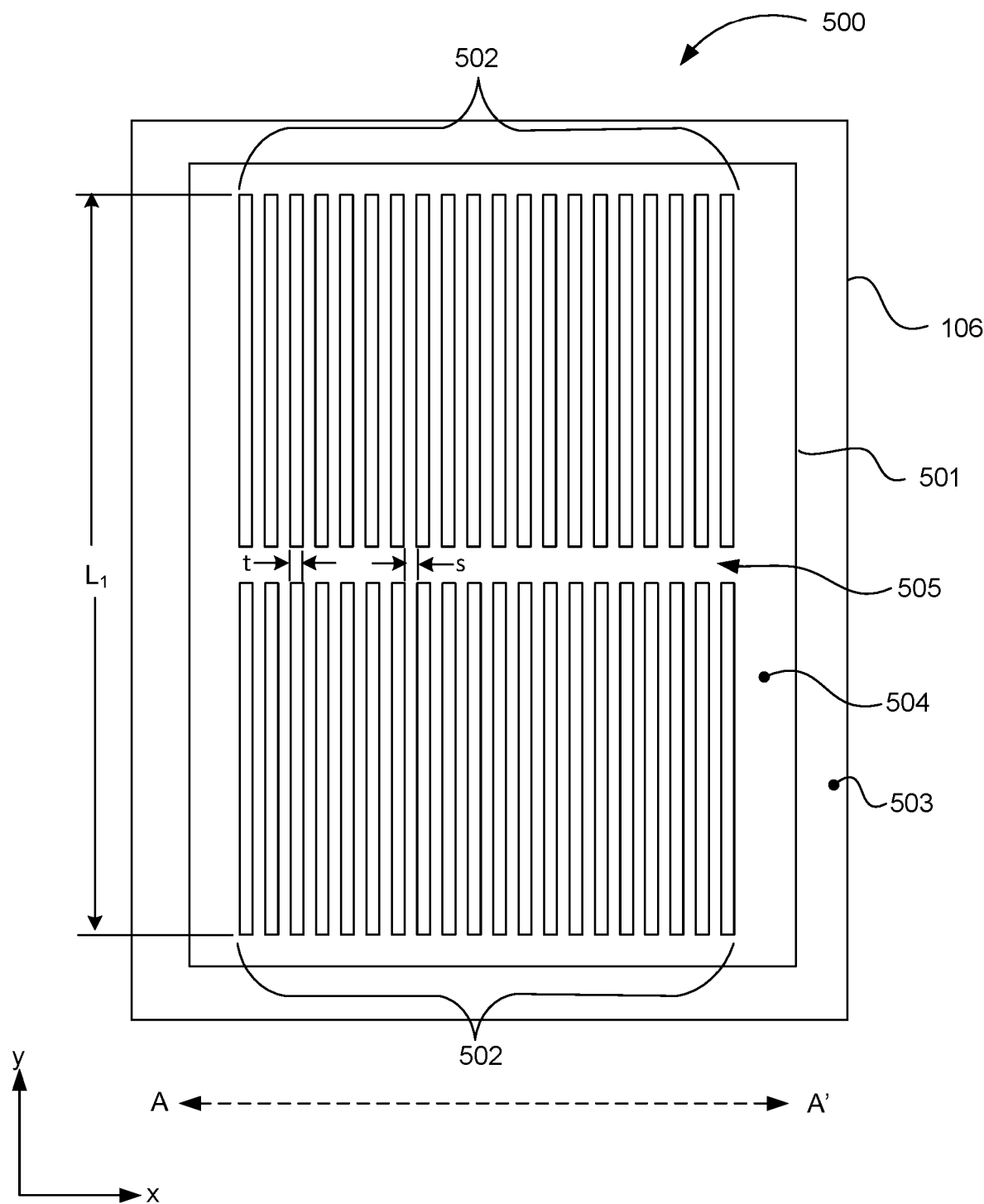
FIG. 5B illustrates a plan view in the x-y plane of the loading mechanism of FIG. 5A, according to some embodiments of the disclosure.

FIG. 5B illustrates a plan view in the x-y plane of loading mechanism 500, showing back plate 501 comprising heat dissipating fins 502, according to some embodiments of the disclosure.

Loading mechanism 500 is depicted in plan view in FIG. 5B below plane A-A' of FIG. 5A to show features that are under the heat sink component of loading mechanism 300b (e.g., heat sink 105 in FIG. 5A). In FIG. 5B, the plan view of loading mechanism 500 is shown below the level of plane A-A' in FIG. 5A, showing lower surface 503 of PCB 106 and lower surface 504 of base plate 501. The plan view shows heat dissipation fins 502 extending a length $L_1$ along the long dimension (e.g., in the y-dimension of the figure) of back plate 501. In some embodiments, heat dissipation fins 502 may extend in the x-dimension, that is, across the short lateral dimension of finned back plate 501. The particular orientation of heat dissipation fins 502 may depend on the prevailing direction of air flow in the keep-out zone below PCB 106. In some embodiments, heat dissipation fins 502 have one or more gaps 505 separating banks of heat dissipation fins. 502.

As shown in FIG. 5A, individual heat dissipation fins 502 have a thickness t and separation spacing s. The parameters t and s may be optimized to provide maximal convective heat transfer to the surroundings in relation to the direction, velocity and temperature of the air in the environment of finned back plate 501 (e.g., the keep-out zone below the motherboard).

Figure 6A:
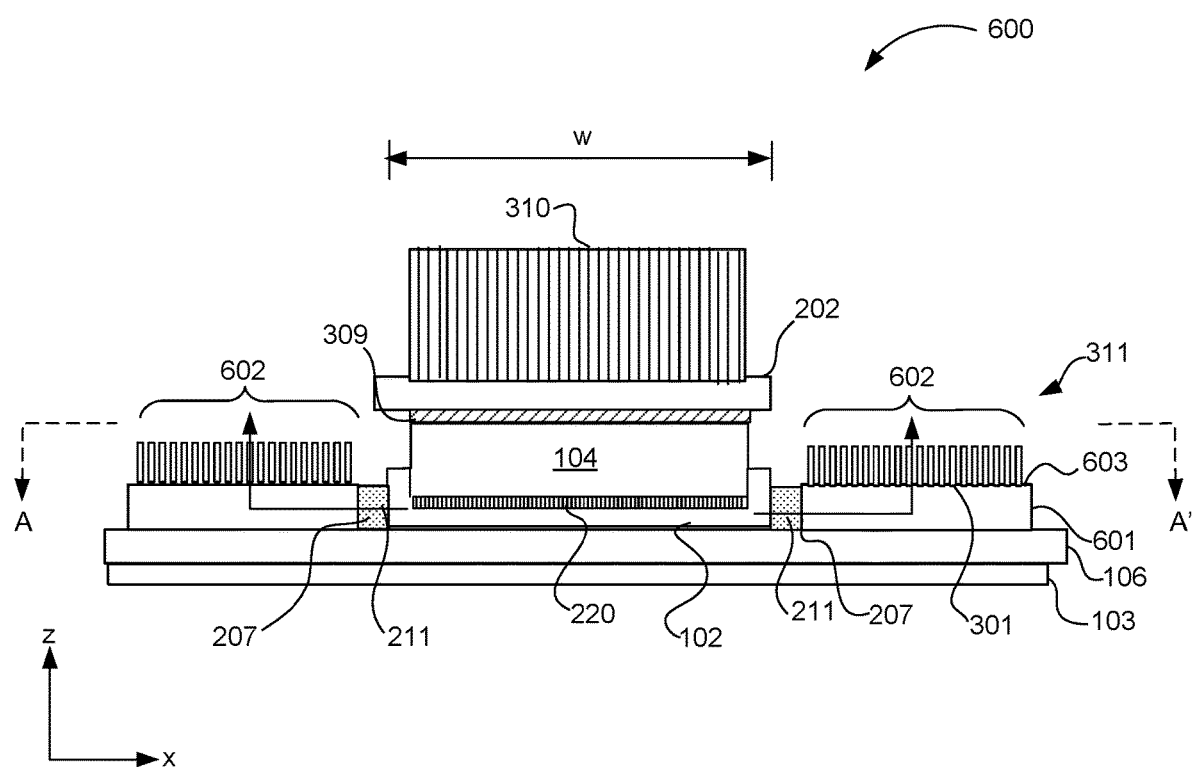
FIG. 6A illustrates a cross-sectional view in the x-z plane of a loading mechanism comprising heat dissipation fins, according to some embodiments of the disclosure.

FIG. 6A illustrates a cross-sectional view in the x-z plane of loading mechanism 600, according to some embodiments of the disclosure.

Loading mechanism 600 comprises bolster plate 601, comprising heat dissipation fins 602 on upper surface 603 of bolster plate 601. In the illustrated embodiment, heat dissipation fins 602 are bonded directly to upper surface 603 of bolster plate 601. Rejection of heat from bolster plate 601 may be enabled by forced air flow through or across heat dissipation fins 602. Heat emanating from interconnect plane 220 may travel through TIM fill 211 in gap 207 between socket 102 to bolster plate 601. The exemplary thermal path is indicated by the bent arrows.

The conventional heat flow path may be directly to heat sink 310 through IC device 104 to heat sink base plate 202. Conductive heat transfer between IC device 104 and heat sink base plate 202 may be increased by TIM layer 309. Heat dissipation fins 602 may enhance additional heat rejection by bolster plate 601, supplementing the conventional heat flow path through heat sink 310.

Figure 6B:
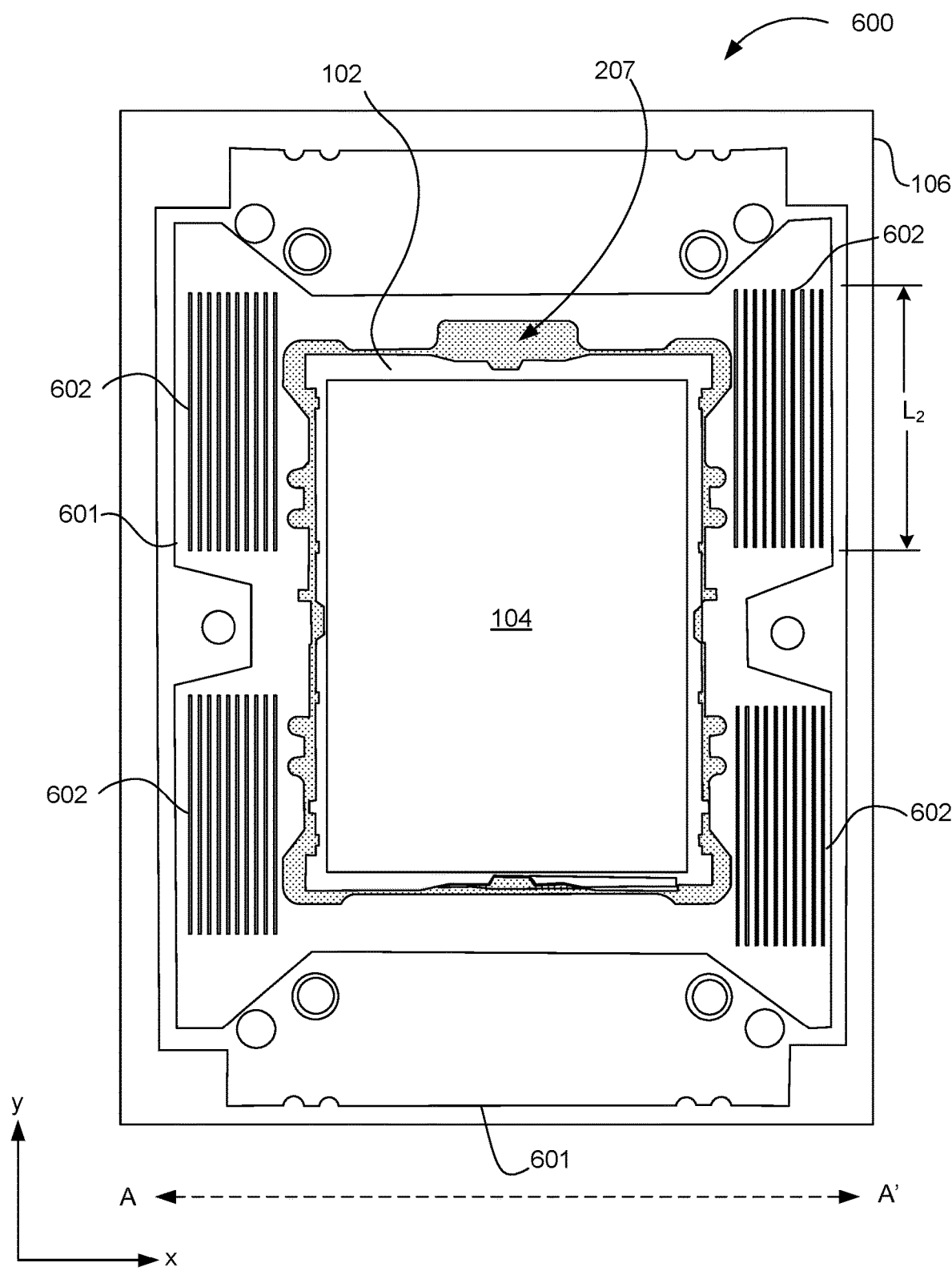
FIG. 6B illustrates a plan view in the x-y plane of the loading mechanism of FIG. 6A, according to some embodiments of the disclosure.

FIG. 6B illustrates a plan view in the x-y plane of loading mechanism 600, according to some embodiments of the disclosure.

In FIG. 6B, the plan view of loading mechanism 600 is shown below the level of plane A-A' in FIG. 6A, showing bolster plate 601 and the arrangement of heat dissipation fins 602. In the illustrated embodiment, heat dissipation fins 602 are arranged in four separate sections placed around aperture 207 (surrounding socket 102 and IC device 104) to conform to the geometry of bolster plate 601. The four sections each span a length L2 that may cover approximately half of the long dimension of bolster plate 601. Other arrangements are possible, depending on the particular geometry of bolster plate 601.

Figure 7A:
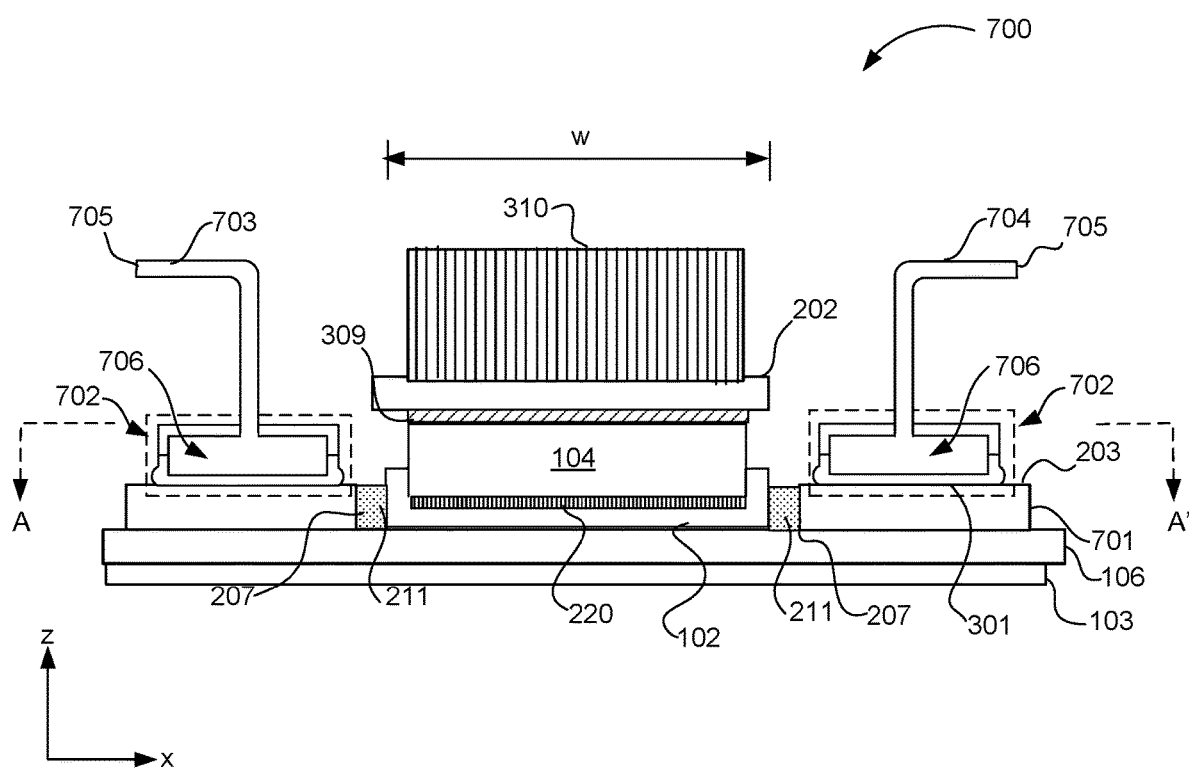
FIG. 7A illustrates a cross-sectional view in the x-z plane of a loading mechanism comprising a cold plate, according to some embodiments of the disclosure.

FIG. 7A illustrates a cross-sectional view in the x-z plane of loading mechanism 700 comprising cold plate 701, according to some embodiments of the disclosure.

Loading mechanism 700 comprises bolster plate 701 comprising attached cold plate 702. In the illustrated embodiment, cold plate 702 is a rectangular ring structure surrounding aperture 207 containing TIM fill 211 and socket 102. In some embodiments, cold plate 702 comprises inlet port 703 and outlet port 704.

Cold plate 701 may be formed from stamped, forged or machined copper, or steel plate. Wall thickness may range from 1 mm to 3 mm. Inlet and outlet ports 703 and 704, respectively, may be formed from steel or copper tubing and welded to cold plate 701. A tubing receptacle or quick-connect nozzle may be attached at port mouths 705.

A low temperature fluid may be introduced into cavity 706 by inlet port 703, and circulate within cavity 706, exiting by outlet port 704. External tubing (not shown) may be connected to inlet port 703 and outlet port 704, leading to a recirculation pump and cooling tank (not shown). Suitable circulating fluids include, but are not limited to, water, low molecular weight alcohols, glycols such as ethylene glycol, and ammonia.

Heat emanating from interconnect plane 220 may flow through socket 102 through TIM fill 211 to bolster plate 701. When a fluid is circulated within cold plate 702, the wall temperature of cold plate 702 may be up to several degrees below room temperature. Heat flowing to cold plate 702 from bolster plate 701 may be readily absorbed. Rejection of heat may be through the circulating fluid to heat exchanger external to cold plate 702 near the recirculation pump.

Figure 7B:
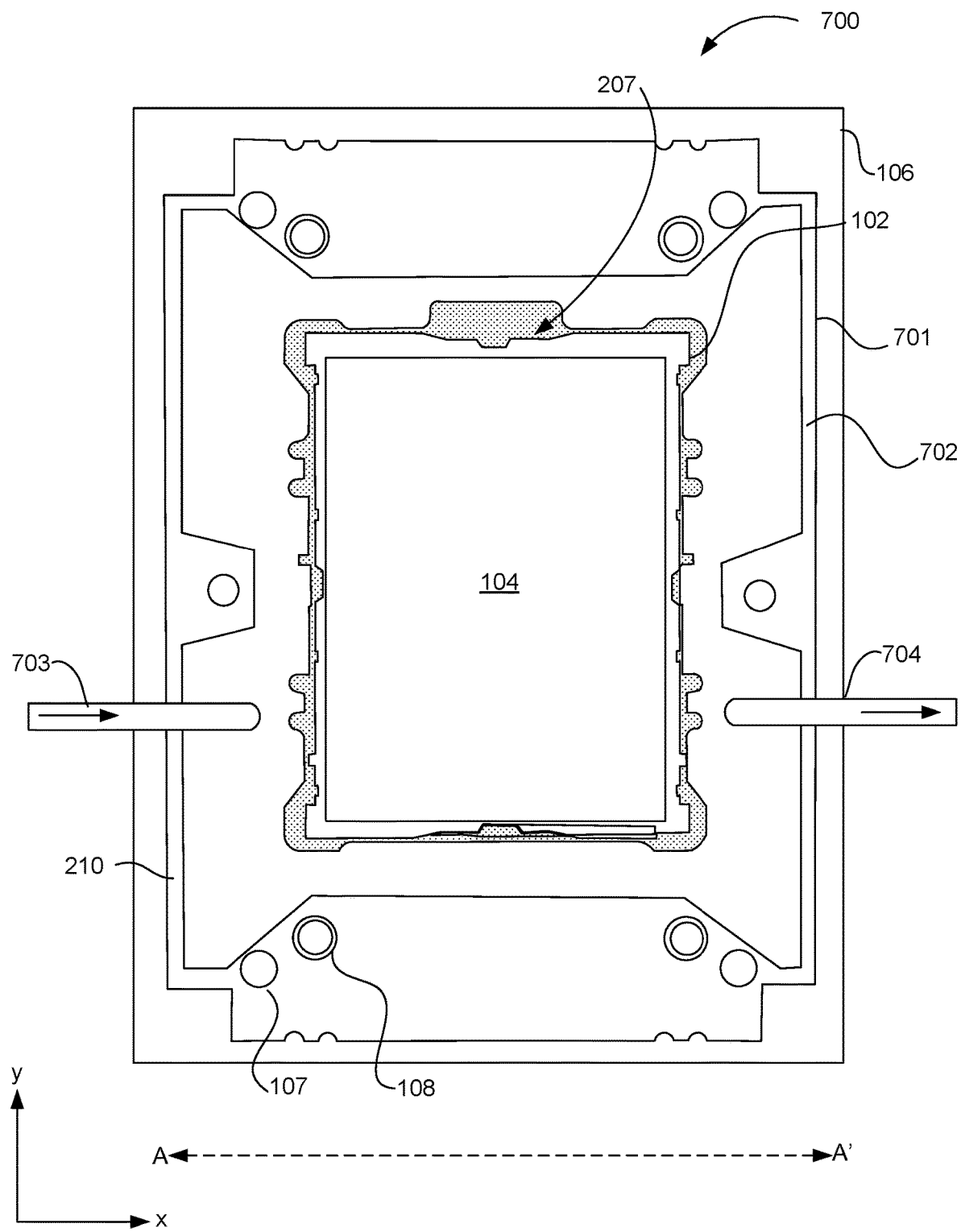
FIG. 7B illustrates a plan view in the x-y plane of the loading mechanism of FIG. 7A, according to some embodiments of the disclosure.

FIG. 7B illustrates a plan view in the x-y plane of loading mechanism 700, showing cold plate 702, according to some embodiments of the disclosure.

In FIG. 7B, the plan view of loading mechanism 700 is shown below the level of plane A-A' in FIG. 7A, showing bolster plate 701 and the arrangement of cold plate 702. In the illustrated embodiment, cold plate 702 has a contour compliant to bolt pattern (e.g., bolts 108 and studs 107) on bolster plate 701. Cold plate 702 may be attached to bolster plate 701 by fasteners such as machine screws, diffusion bonding, brazing, or soldering.

Cold plate 702 comprises four contiguous sides, forming a ring structure that surrounds aperture 207 containing IC device 104 seated in socket 102. Fluid within the cavity (e.g., cavity 706) may circulate around aperture 207, absorbing heat emanating in all lateral directions from IC device 104 and socket 102. Inlet and outlet ports 703 and 704, respectively, are shown to be in the same y-z plane, but it is understood that outlet port 704 may be displaced in the y-dimension from inlet port 703.

Figure 8A:
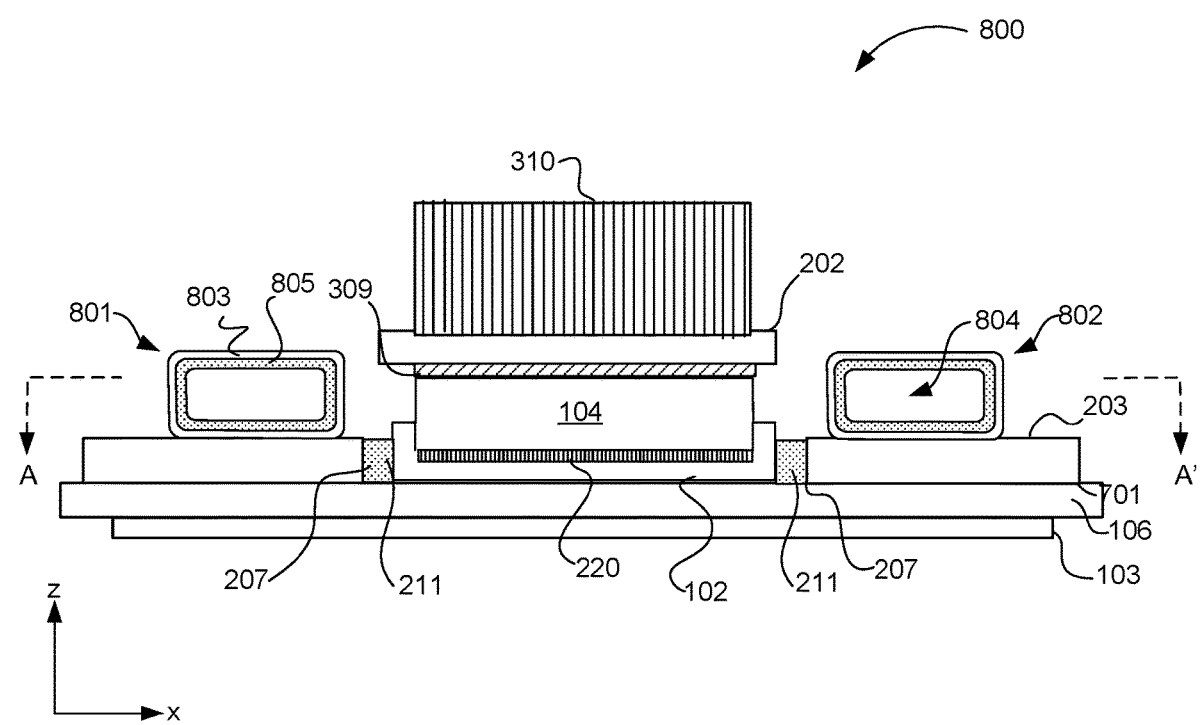
FIG. 8A illustrates a cross-sectional view in the x-z plane of a loading mechanism comprising heat pipes, according to some embodiments of the disclosure.

FIG. 8A illustrates a cross-sectional view in the x-z plane of loading mechanism 800 comprising heat pipes 801 and 802, according to some embodiments of the disclosure.

Loading mechanism 800 comprises heat pipes 801 and 802 adjacent to upper surface 203 of bolster plate 101. In some embodiments, heat pipes 801 and 802 are tubular heat exchange structures that extend above and below the plane of the figure in the y-dimension and off of bolster plate 101. Heat pipes 801 and 802 have blind terminations at both extremities (e.g., extremities 807 in FIG. 8B) that interface with external heat dissipation structures such as a finned heat sink. Heat pipes 801 and 802 comprise tube wall 803 enclosing cavity 804. The inner surface of tube wall 803 supports wicking structure 805. Wicking structure 805 may have a similar composition and fine structure as wicking structure 306.

A working fluid may be sealed into cavity 804 and infiltrate wicking structure 805. Heat emanating from interconnect plate 220 between IC device 104 and socket 102 may flow through TIM fill 211 in aperture 207 to bolter plate 101. As described above, heat emanating from interconnect plane 220 may flow through IC device 104 directly to loading mechanism heat sink 105 through TIM 309. A second heat flow path having a lower thermal resistance may extend through PCB 106 and/or back plate 103 to bolster plate 101 from below.

The working fluid may absorb heat penetrating through tube wall 803 into wicking structure 805. Heat may be transferred to the working fluid, which may vaporize into interior space 806. Vapors may equilibrate with liquid working fluid within wicking structure 805 along the length of heat pies 801 and 802 (in the y-dimension) as they travel within cavity 804 to the extremities. Heat may be carried by the working fluid vapor from the hottest portion of heat pipes 801 and 802 that may be adjacent to bolster plate 101, to the cooler portions (e.g., at the extremities) where tube wall 803 may be in contact with a heat sink.

A vaporization/condensation cycle of the working fluid may be established within heat pipes 801/2 when heat is transferred to the heat sink as vapors condense within wicking structure 805. Condensed working fluid may flow toward the central portions of heat pipes 801/2 (over warmed bolster plate 101 heated by heat from IC device 104 flowing through socket 102 and TIM fill 211) by capillarity and/or surface tension to replenish vaporized working fluid within wicking structure 805. Natural convection from the exterior surface of tube wall 803 may dissipate heat from the working fluid along the length of heat pipes 801/2 directly into the surroundings.

Figure 8B:
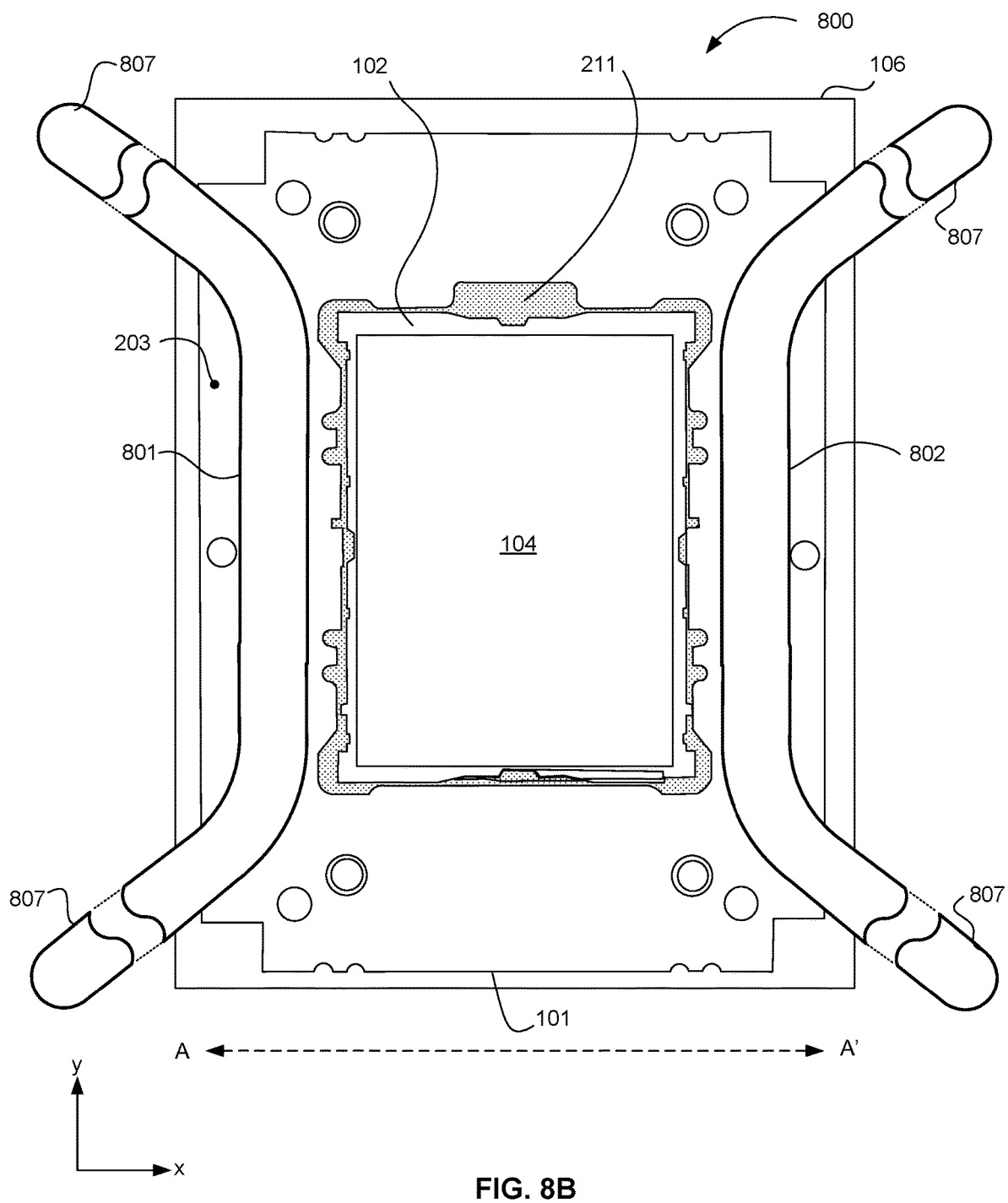
FIG. 8B illustrates a plan view in the x-y plane of the loading mechanism of FIG. 8A, according to some embodiments of the disclosure.

FIG. 8B illustrates a plan view in the x-y plane of loading mechanism 800, comprising heat pipes 801 and 802, according to some embodiments of the disclosure.

In FIG. 8B, the plan view of loading mechanism 800 is shown below the level of plane A-A' in FIG. 8A. Heat pipes 801 and 802 may extend along the y-dimension on surface 203 of bolster plate 101. In the illustrated embodiment, heat pipes 801/2 extend at an oblique angle off of bolster plate 101 (near the corners) towards heat pipe extremities 807. It is understood that the particular shape configuration of heat pipes 801/2 is not limited to the illustrated embodiment, and that any suitable geometry may equally be embodied by heat pipes 801/2. In some embodiments, additional heat pipes may be employed to increase heat transfer from bolster plate 101.

Heat pipe extremities 807 may be interfaced to heat sinks or other heat dissipation devices. The distance between extremities 807 and central portions 808 of heat pipes 801/2 may be in part determined by space and design limitations of the particular implementation of loading mechanism 800.

Figure 9:
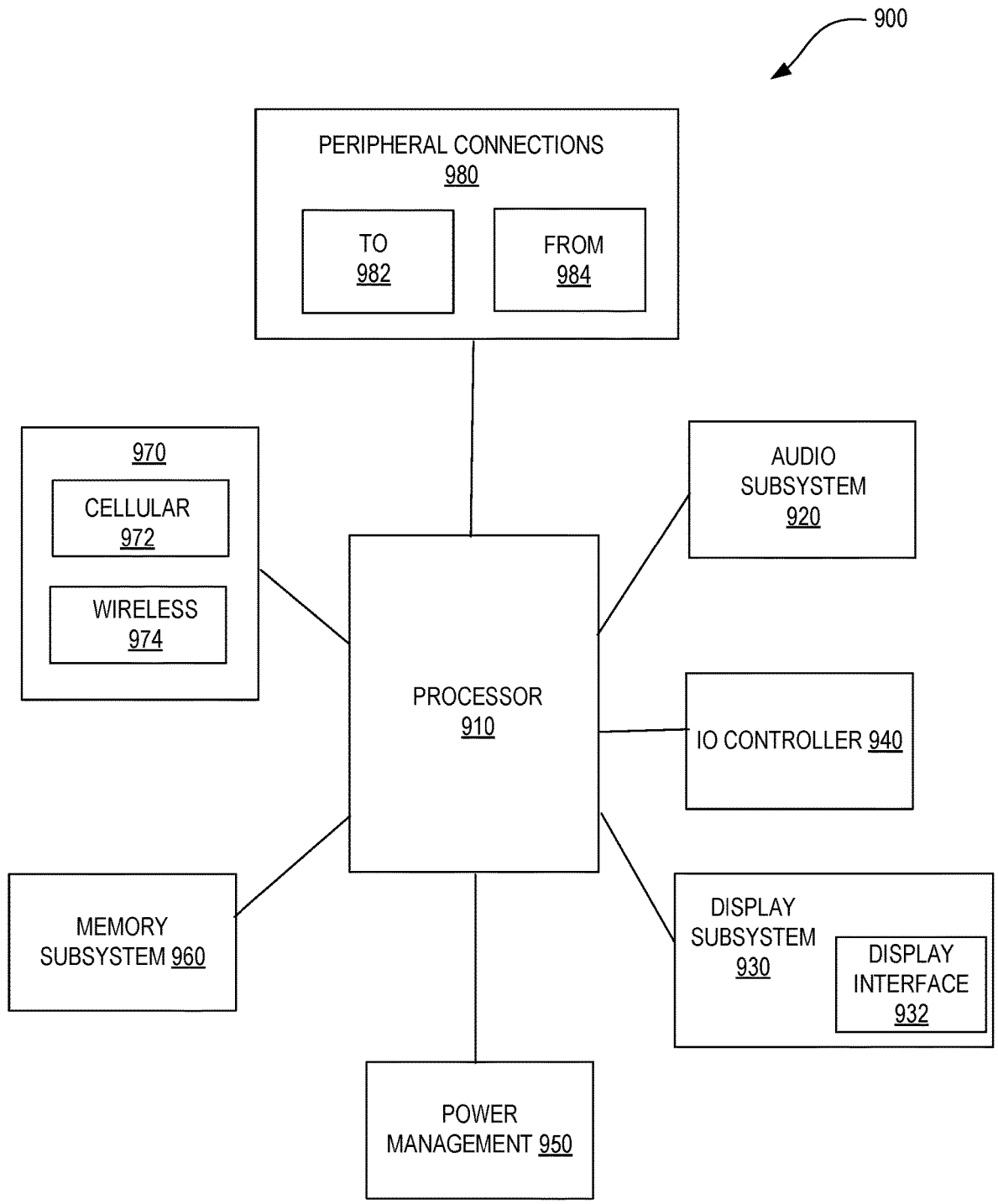
FIG. 9 illustrates a block diagram of a computing device as part of a system-on-chip (SoC) package in an implementation of a computing device, according to some embodiments of the disclosure.

FIG. 9 illustrates a block diagram of computing device 900 as part of a system-on-chip (SoC) package in an implementation of a computing device, according to some embodiments of the disclosure.

According to some embodiments, computing device 900 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit. In some embodiments, the IC package is mounted in a loading mechanism according to the embodiments of the disclosure (e.g., any of the disclosed loading mechanisms 200, 300a 300b, 400a, 400b, 500, 600, 700 or 800).

In some embodiments, computing device 900 has wireless connectivity (e.g., Bluetooth, WiFi and 5G network). It will be understood that certain components are shown generally, and not all components of such a device are shown in computing device 900.

The various embodiments of the present disclosure may also comprise a network interface within 970 such as a wireless interface so that a system embodiment may be incorporated into a wireless device, for example, cell phone or personal digital assistant. The wireless interface includes a millimeter wave generator and antenna array.

According to some embodiments, processor 910 represents a CPU or a GPU, and can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is a microprocessor mounting apparatus, comprising a microprocessor socket on a printed circuit board (PCB); a bolster plate surrounding a perimeter of the microprocessor socket, wherein the bolster plate has a first surface adjacent to the PCB, and a second surface opposite the first surface; and a heat dissipation device on the second surface of the bolster plate, wherein the heat dissipation interface is thermally coupled to the microprocessor socket.

Example 2 includes all of the features of example 1, wherein a thermal interface material is between the bolster plate and the microprocessor socket, and wherein the microprocessor socket is thermally coupled to the bolster plate by the thermal interface material.

Example 3 includes all of the features of example 2, wherein the thermal interface material is a thermal grease, a thermal paste, a thermal gel or a thermal pad.

Example 4 includes all of the features of examples 1 or 2, wherein the heat dissipation device comprises a plurality of heat-dissipation fins over the second surface of the bolster plate.

Example 5 includes all of the features of any one of examples 1 through 4, wherein the heat dissipation device is a vapor chamber joined to the second surface of the bolster plate, and to a heat sink.

Example 6 includes all of the features of example 5, wherein the vapor chamber is joined to the bolster plate by a braze bond, a diffusion bond or an adhesive bond.

Example 7 includes all of the features of examples 5 or 6, wherein the vapor chamber comprises a plurality of heat-dissipation fins.

Example 8 includes all of the features of any one of examples 1 through 7, wherein the heat dissipation device comprises a heat pipe joined to the second surface of the bolster plate.

Example 9 includes all of the features of example 8, wherein the heat pipe is joined to the bolster plate by an adhesive bond, a braze bond or a solder bond.

Example 10 includes all of the features of examples 8 or 9, wherein the heat pipe comprises a plurality of heat-dissipation fins.

Example 11 includes all of the features of any one of examples 1 through 10, wherein the heat dissipation device comprises a cold plate interfaced to the second surface of the bolster plate.

Example 12 includes all of the features of example 11, wherein the heat dissipation device further comprises a conduit coupled to the cold plate, and wherein the conduit is to conduct a fluid to and from the cold plate.

Example 13 includes all of the features of example 12, wherein the heat transfer fluid comprises at least one of water, methanol, ethanol, isopropanol or n-propanol.

Example 14 includes all of the features of any one of examples 11 through 13, wherein the cold plate is joined to the bolster plate by a braze bond, a diffusion bond or an adhesive bond.

Example 15 is an assembly, comprising a microprocessor socket on a first surface of a printed circuit board; a bolster plate around a perimeter of the microprocessor socket, wherein a thermal interface material is between the microprocessor socket and the bolster plate, and wherein the bolster plate has a first surface adjacent to the printed circuit board, and a second surface opposite the first surface; a heat dissipation device on the second surface of the bolster plate; a back plate on a second surface of the printed circuit board and coupled to the bolster plate, wherein the second surface is opposite the first surface; and a heat sink or heat pipe mechanically coupled to the bolster plate.

Example 16 includes all of the features of example 15, wherein the heat sink or heat pipe is thermally coupled to the heat dissipation device Example 17 includes all of the features of examples 15 or 16, wherein the heat dissipation device comprises a plurality of heat-dissipation fins.

Example 18 includes all of the features of any one of examples 15 through 17, wherein the heat dissipation device is a first heat dissipation device, and wherein a second heat dissipation device is on a surface of the back plate.

Example 19 is a system, comprising a printed circuit board having a first surface and a second surface opposite the first surface; a microprocessor socket on the first surface of the printed circuit board; and a microprocessor mounting apparatus over the first surface of the printed circuit board, the microprocessor mounting apparatus comprising a bolster plate around a perimeter of the microprocessor socket, the bolster plate having a third surface adjacent to the printed circuit board, and a fourth surface opposite the third surface; a thermal interface material between the microprocessor socket and the bolster plate; a back plate adjacent to the second surface of the printed circuit board; and a plurality of studs that extend from the back plate, through the printed circuit board, and over the first surface of the printed circuit board, wherein the plurality of studs mechanically and thermally couple the back plate to the bolster plate.

Example 20 includes all of the features of example 19, further comprising a vapor chamber, a plurality of heat dissipation fins, or a heat pipe coupled to the bolster plate.

An abstract is submitted with the understanding that it will not be used to limit the scope or meaning of the claims. The following claims are hereby incorporated into the detailed description, with each claim standing on its own as a separate embodiment.

We claim:

1. A microprocessor mounting apparatus, comprising:
   a microprocessor socket on a printed circuit board (PCB);
   a bolster plate surrounding a perimeter of the microprocessor socket, wherein the bolster plate has a first surface adjacent to the PCB, and a second surface opposite the first surface; and
   a heat dissipation device on the second surface of the bolster plate, wherein the heat dissipation device is thermally coupled to the microprocessor socket through the bolster plate.

2. The microprocessor mounting apparatus of claim 1, wherein a thermal interface material is between the bolster plate and the microprocessor socket, and wherein the microprocessor socket is thermally coupled to the bolster plate by the thermal interface material.

3. The microprocessor mounting apparatus of claim 2, wherein the thermal interface material is a thermal grease, a thermal paste, a thermal gel or a thermal pad.

4. The microprocessor mounting apparatus of claim 1, wherein the heat dissipation device comprises a plurality of heat-dissipation fins over the second surface of the bolster plate.

5. The microprocessor mounting apparatus of claim 1, wherein the heat dissipation device is a vapor chamber joined to the second surface of the bolster plate, and to a heat sink.

6. The microprocessor mounting apparatus of claim 5, wherein the vapor chamber is joined to the bolster plate by a braze bond, a diffusion bond or an adhesive bond.

7. The microprocessor mounting apparatus of claim 5, wherein the vapor chamber comprises a plurality of heat-dissipation fins.

8. The microprocessor mounting apparatus of claim 1, wherein the heat dissipation device comprises a heat pipe joined to the second surface of the bolster plate.

9. The microprocessor mounting apparatus of claim 8, wherein the heat pipe is joined to the bolster plate by an adhesive bond, a braze bond or a solder bond.

10. The microprocessor mounting apparatus of claim 8, wherein the heat pipe comprises a plurality of heat-dissipation fins.

11. The microprocessor mounting apparatus of claim 1, wherein the heat dissipation device comprises a cold plate interfaced to the second surface of the bolster plate.

12. The microprocessor mounting apparatus of claim 11, wherein the heat dissipation device further comprises a conduit coupled to the cold plate, and wherein the conduit is to conduct a fluid to and from the cold plate.

13. The microprocessor mounting apparatus of claim 12, wherein the fluid comprises at least one of water, methanol, ethanol, isopropanol or n-propanol.

14. The microprocessor mounting apparatus of claim 11, wherein the cold plate is joined to the bolster plate by a braze bond, a diffusion bond or an adhesive bond.

15. An assembly, comprising:
    a microprocessor socket on a first surface of a printed circuit board;
    a bolster plate around a perimeter of the microprocessor socket, wherein a thermal interface material is between the microprocessor socket and the bolster plate, and wherein the bolster plate has a first surface adjacent to the printed circuit board, and a second surface opposite the first surface;
    a heat dissipation device on the second surface of the bolster plate;
    a back plate on a second surface of the printed circuit board and coupled to the bolster plate, wherein the second surface is opposite the first surface.

16. The assembly of claim 15, wherein a heat sink or heat pipe is thermally coupled to the heat dissipation device.

17. The assembly of claim 15, wherein the heat dissipation device comprises a plurality of heat-dissipation fins.

18. The assembly of claim 15, wherein the heat dissipation device is a first heat dissipation device, and wherein a second heat dissipation device is on a surface of the back plate.

19. A system, comprising:
    a printed circuit board having a first surface and a second surface opposite the first surface;
    a microprocessor socket on the first surface of the printed circuit board; and
    a microprocessor mounting apparatus over the first surface of the printed circuit board,
    the microprocessor mounting apparatus comprising:
       a bolster plate around a perimeter of the microprocessor socket, the bolster plate having a third surface adjacent to the printed circuit board, and a fourth surface opposite the third surface;
       a thermal interface material between the microprocessor socket and the bolster plate;
       a back plate adjacent to the second surface of the printed circuit board; and
       a plurality of studs that extend from the back plate, through the printed circuit board, and over the first surface of the printed circuit board, wherein the plurality of studs mechanically and thermally couple the back plate to the bolster plate.

20. The system of claim 19, further comprising a vapor chamber, a plurality of heat dissipation fins, or a heat pipe coupled to the bolster plate.

* * * * *